United States Patent
Jang et al.

(10) Patent No.: US 7,700,445 B2
(45) Date of Patent: Apr. 20, 2010

(54) METHOD FOR FABRICATING MULTIPLE FETS OF DIFFERENT TYPES

(75) Inventors: Se-Myeong Jang, Anyang-si (KR); Makoto Yoshida, Suwon-si (KR); Jae-Rok Kahng, Seoul (KR); Chul Lee, Seoul (KR); Keun-Nam Kim, Suwon-si (KR); Hyun-Ju Sung, Seoul (KR); Hui-Jung Kim, Seoul (KR); Kyoung-Ho Jung, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 378 days.

(21) Appl. No.: 11/804,875

(22) Filed: May 21, 2007

(65) Prior Publication Data
US 2007/0298599 A1 Dec. 27, 2007

(30) Foreign Application Priority Data
Jun. 8, 2006 (KR) .................. 10-2006-0051408

(51) Int. Cl.
*H01L 21/336* (2006.01)

(52) U.S. Cl. ............... 438/283; 257/401; 257/E21.429

(58) Field of Classification Search .............. 257/401, 257/E29.275, E21.429; 438/176, 283, 589
See application file for complete search history.

(56) References Cited

U.S. PATENT DOCUMENTS

2003/0085424 A1* 5/2003 Bryant et al. ............... 257/347

OTHER PUBLICATIONS

Korean Patent Application No. 1020040029118 to Ahn et al., having Publication date of Nov. 1, 2005 (w/ English Abstract page).
Korean Patent Application No. 1020040049003 to Kim et al., having Publication date of Jan. 6, 2006 (w/ English Abstract page).
Japanese Patent Application No. 04-175407 to Kazuhiko et al., having Publication date of Aug. 6, 1993 (w/ English Abstract page).

* cited by examiner

*Primary Examiner*—David Vu
(74) *Attorney, Agent, or Firm*—Monica H. Choi

(57) ABSTRACT

For fabricating multiple field effect transistors (FETs), a first conductive layer is deposited over first and second active regions of a semiconductor substrate. The first conductive layer is patterned over the second active region to form mold structures. Mask structures are formed between the mold structures. The second active region is patterned using the mask structures or using spacers formed at sidewalls of the mold structures to form multiple fins of a field effect transistor of a fin type. The first conductive layer is patterned over the first active region to form a gate of another field effect transistor of a different type.

20 Claims, 22 Drawing Sheets

METHOD FOR FABRICATING MULTIPLE FETS OF DIFFERENT TYPES

BACKGROUND OF THE INVENTION

This application claims priority under 35 USC § 119 to Korean Patent Application No. 2006-51408, filed on Jun. 8, 2006 in the Korean Intellectual Property Office, the disclosure of which is incorporated herein in its entirety by reference.

1. Field of the Invention

The present invention relates generally to fabrication of integrated circuits, and more particularly to fabricating structures of different types of field effect transistors with high integrity.

2. Description of the Related Art

Integrated circuits such as semiconductor memory devices generally include transistors such as MOSFETs (metal oxide semiconductor field effect transistors). MOSFETs having various structures and characteristics may be used in a semiconductor memory device. For example, a MOSFET of a planar type or a MOSFET with one fin is formed in a cell area of a semiconductor memory device. Additionally for improved response speed with increased channel regions, a MOSFET with multiple fins is formed in a peripheral area and a core area of the semiconductor memory device. Furthermore, another MOSFET of the planar type is formed in the peripheral area and the core area.

Processes for fabricating such transistors with different structures and characteristics may be complicated, and such transistors may have failures generated from such fabrication processes. For example, a MOSFET of a planar type and a MOSFET with multiple fins are simultaneously formed on different areas of a semiconductor substrate. In that case, a first gate oxide layer and a first gate conductive layer for the MOSFET of the planar type are formed in first and second active regions of the substrate. Portions of the first gate oxide layer and the first gate conductive layer in the second active region are removed to expose the second active region of the substrate.

Thereafter, a second gate oxide layer and a second gate conductive layer are formed on the multiple fins exposed in the second active region of the substrate. During removal of the first gate oxide layer from the second active region, the fins in the second active region may be etched to be degraded structurally. For example, the widths of the fins may be excessively reduced. Alternatively, during formation of the first gate oxide, the fins in the second active region may be oxidized. Such changes to the fins would deteriorate characteristics of the MOSFETs formed in the second active region.

Further, thermal budgets may be created for the first gate conductive layer and the first gate oxide layer during several oxidation processes performed at high temperature for the structures subsequently formed in the second active region. Additionally when the second gate conductive layer is formed with metal, the first gate conductive layer may be contaminated during formation of the second gate conductive layer. Such contamination may cause failure in the MOSFET of the planar type in the first active region.

Thus, a mechanism for fabricating field effect transistors of different types with high performance integrity is desired.

SUMMARY OF THE INVENTION

For fabricating multiple field effect transistors (FETs) according to one aspect of the invention, a first conductive layer is deposited over first and second active regions of a semiconductor substrate. The first conductive layer is patterned over the second active region to form mold structures. At least one mask structure is formed between the mold structures. The second active region is patterned such that a remaining portion of the semiconductor substrate under each of the at least one mask structure forms a respective fin of a second field effect transistor (FET). The first conductive layer is patterned over the first active region to form a first gate of a first field effect transistor (FET).

In another aspect of the present invention, a plurality of mask structures are formed between the mold structures, and the second active region is patterned such that remaining portions of the semiconductor substrate under the mask structures forms multiple fins of the second FET.

In an embodiment of the present invention, a gate dielectric material is formed on the fins, and a second conductive layer formed over the gate dielectric material is patterned to form a second gate of the second FET.

In a further embodiment of the present invention, a conductive film is formed between the gate dielectric material and the second conductive layer to adjust a threshold voltage of the second FET. In an example embodiment of the present invention, the conductive film is comprised of one of titanium, tantalum, titanium nitride, or tantalum nitride.

In another embodiment of the present invention, a dopant is implanted into the fins before forming the gate dielectric material.

In a further embodiment of the present invention, a third conductive layer is deposited on the first and second conductive layers. The first and third conductive layers are patterned to form the first gate of the first FET, and the second and third conductive layers are patterned to form the second gate of the second FET.

In another embodiment of the present invention, a buffer layer is formed to remain over the first conductive layer in the first active region while the mold structures are being formed over the second active region.

In a further embodiment of the present invention, a first gate dielectric material of the first FET is formed between the first conductive layer and the substrate. In that case, the first gate dielectric material and the first conductive layer are patterned over the substrate to form the first FET of a planar type.

In another embodiment of the present invention, a trench isolation structure is formed to surround the first active region. Portions of the trench isolation structure are etched away to expose side walls of the first active region to form a single fin of the first FET. A gate dielectric material is formed at exposed surfaces of the semiconductor substrate in the first active region, and the first conductive layer is formed on the gate dielectric material in the first active region.

In a further embodiment of the present invention, the gate dielectric material and the first conductive layer are formed also on an exposed surface of a third active region of the semiconductor substrate. In that case, the gate dielectric material and the first conductive layer are patterned in the third active region to form another field effect transistor (FET) of a planar type.

In another aspect of the present invention, spacers are formed at sidewalls of the mold structures. The second active region is patterned such that remaining portions of the semiconductor substrate under the spacers form fins of a second field effect transistor (FET). The first conductive layer over the first active region is patterned to form a first gate of a first field effect transistor (FET).

In an embodiment of the present invention, filling material is formed between the spacers. Materials surrounding the spacers over the second active region are etched away before the step of patterning the second active region.

In this manner, the gate dielectric material and the conductive material for forming the gate are covered during formation of the fins of the second FET in the second active region to preserve the integrity of such structures of the FETs in the first and third active regions.

BRIEF DESCRIPTION OF THE DRAWINGS

The above and other features and advantages of the present invention will become more apparent when described in detailed exemplary embodiments thereof with reference to the attached drawings in which.

Figure 1:
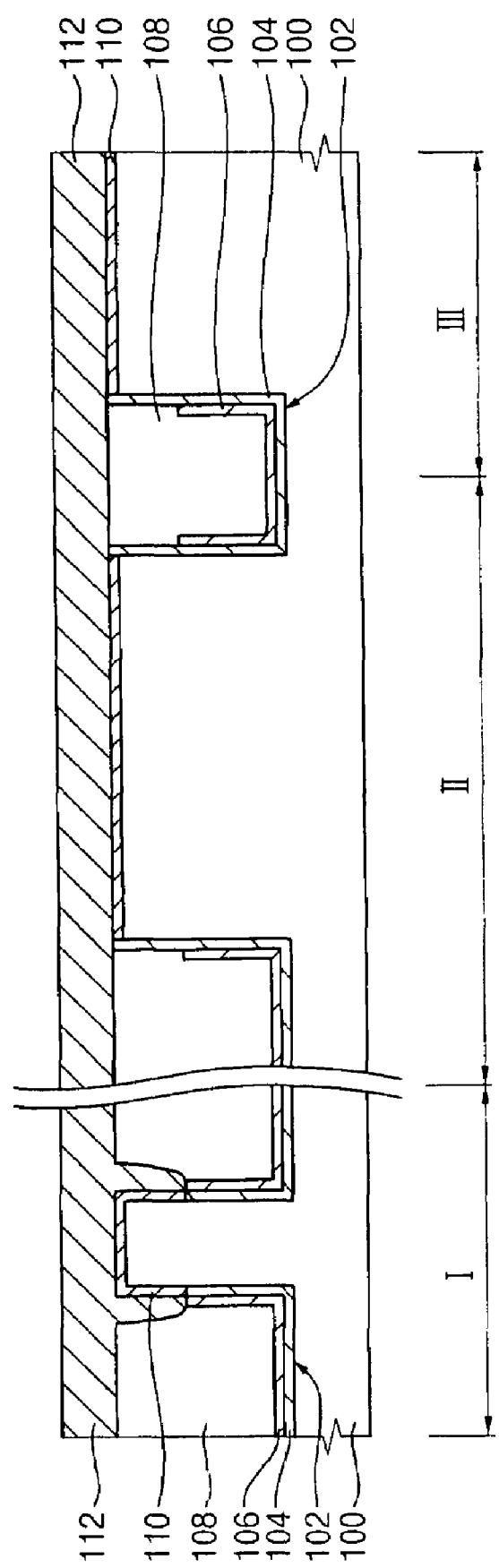
FIGS. 1, 2, 3, 4, 5, 6, 7, 8, 9, 10, 11, 12, 13, 14, 15, and 16 show cross-sectional views during fabrication of multiple field effect transistors according to a first example embodiment of the present invention.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, 20, 21, and 22 refer to elements having similar structure and/or function.

DETAILED DESCRIPTION OF THE INVENTION

The present invention is described more fully hereinafter with reference to the accompanying drawings, in which example embodiments of the invention are shown. The present invention may, however, be embodied in many different forms and should not be construed as limited to the embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "over," "on," "connected to" or "coupled to" another element or layer, it may be directly over, on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, and etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper," "over," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1, 2, 3, 4, 5, 6, 7, 8, 9, 10, 11, 12, 13, 14, 15, and 16 show cross-sectional views during fabrication of multiple MOSFETs (metal oxide semiconductor field effect transistors) according to an example embodiment of the present invention.

Referring to FIG. 1, shallow trench isolation structures 108 are formed in a semiconductor substrate 100 which may be comprised of silicon in an example embodiment of the present invention. Respective shallow trench isolation structures surround each of a first active region, a second active region, and a third active region of the material of the semiconductor substrate 100 in first, second, and third areas I, II, and III, respectively.

In one example embodiment of the present invention, a first MOSFET having a single fin is formed in the first active region, a second MOSFET having multiple fins is formed in the second active region, and a third MOSFET of a planar type is formed in the third active region. The first area I may be in a cell area of a semiconductor device formed on the substrate 100, and the second and third areas II and III may be in a core area and a peripheral circuit area, respectively, of the semiconductor device.

Hereinafter, a fabrication process for fabricating such multiple MOSFETs in the first, second, and third active regions is now described in reference to FIGS. 1, 2, 3, 4, 5, 6, 7, 8, 9, 10, 11, 12, 13, 14, 15, and 16.

Referring to FIG. 1, the shallow trench isolation structures 108 are formed from patterning a pad oxide layer (not shown) and a hard mask layer (not shown) deposited on the substrate 100. The patterned pad oxide and hard mask serve as etching masks for forming trenches 102 within the semiconductor substrate 100. Insulating materials are formed to fill the trenches 102 for forming the isolation structures 108 that surround the first, second, and third active regions.

For example, sidewalls and bottom walls of the trenches 102 are thermally oxidized to form inner oxide layers 104 thereon. Thereafter, nitride liners 106 are formed on the inner oxide layers 104. Subsequently, silicon oxide is formed to fill the trenches 102. Thereafter, a chemical mechanical polishing (CMP) process is performed for containing the silicon oxide within the trenches 102. Such silicon oxide for filling the trenches 102 may include HDP-CVD oxide, TEOS, or USG.

A top portion of the isolation structure 108 surrounding the first active region is etched away to form an opening that exposes an upper portion of at least one sidewall of the first active region. Such an exposed portion of the first active region forms a single fin of the first MOSFET to be formed in the first active region.

Further referring to FIG. 1, a first gate dielectric material 110 is formed on exposed surfaces of the substrate 100 in the first, second, and third active regions. The first gate dielectric material 110 may be comprised of an oxide such as silicon oxide or alternatively may be comprised of a metal oxide having a high dielectric constant.

A first conductive layer 112 is formed on the first gate dielectric material 110 and fills up the opening around the at least one sidewall of the first active region. The first conductive layer 112 may include polysilicon that is deposited by a chemical vapor deposition (CVD) process in an example embodiment of the present invention. Thereafter, the first conductive layer 112 is planarized in a CMP process in an example embodiment of the present invention.

Portions of the first conductive layer 112 on the first and third active regions are later patterned to form gate electrodes. In contrast, a portion of the first conductive layer 112 disposed on the second active region is patterned to form mold structures 120 (see FIG. 4) for forming multiple fins of the second MOSFET.

Figure 2:
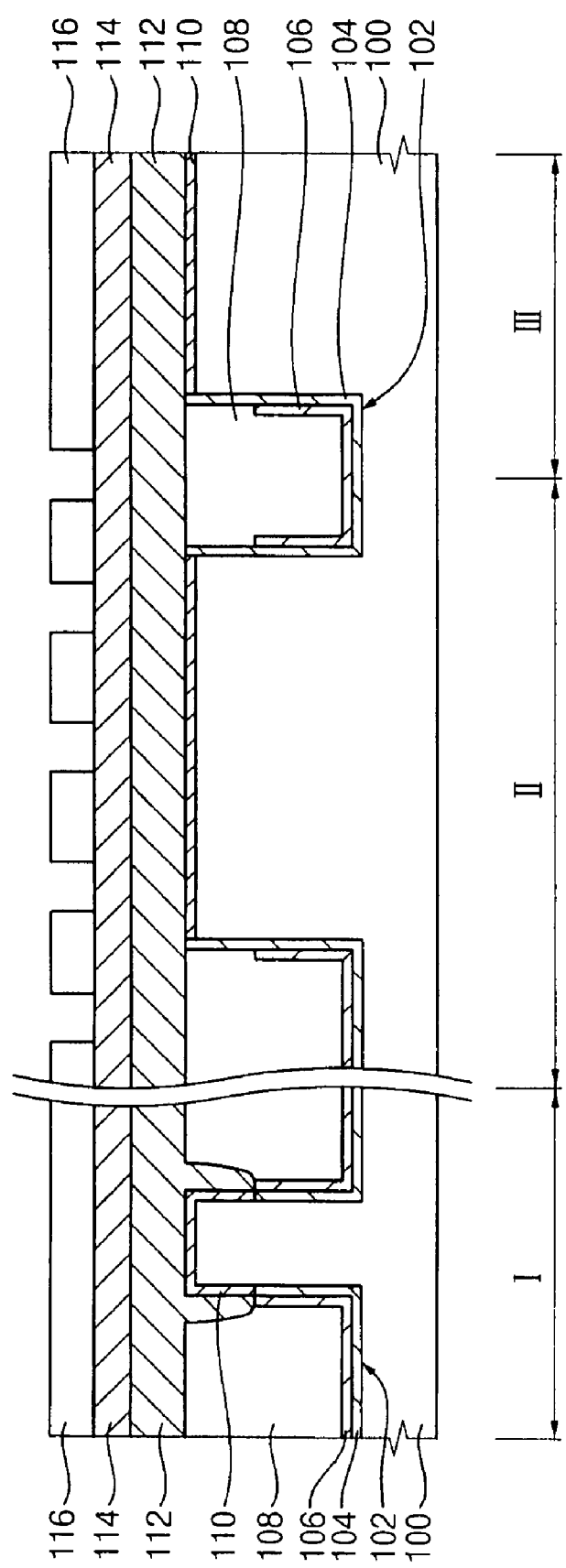

Referring to FIG. 2, a buffer layer 114 is formed on the first conductive layer 112. The buffer layer 114 may include an oxide such as silicon oxide in an example embodiment of the present invention. The buffer layer 114 protects the first conductive layer 112 in the first and third active regions during successive process steps. In addition, the buffer layer 114 is patterned to form hard mask structures 118 of FIG. 3 as now described.

Further referring to FIG. 2, a photoresist material 116 is coated on the buffer layer 114. The photoresist material 116 over the second active region is patterned by exposure and developing processes. In contrast, the photoresist material 116 remains to entirely cover the first and third active regions.

Figure 3:
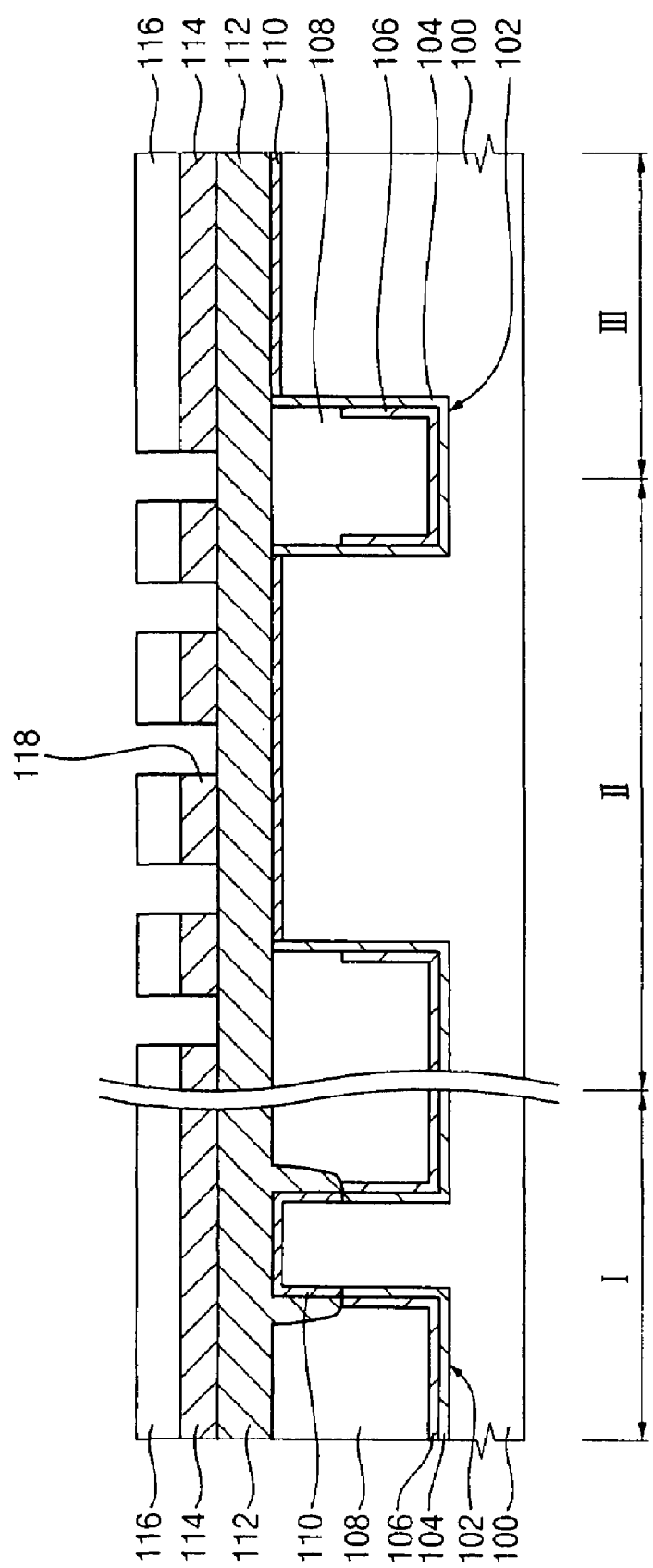

Referring to FIGS. 2 and 3, the buffer layer 114 is partially etched such that portions of the buffer layer 114 under the photoresist material 116 in the second active region form the hard mask structures 118. Note that portions of the buffer layer 114 remain on the first conductive layer 112 within the first and third active regions.

Figure 4:
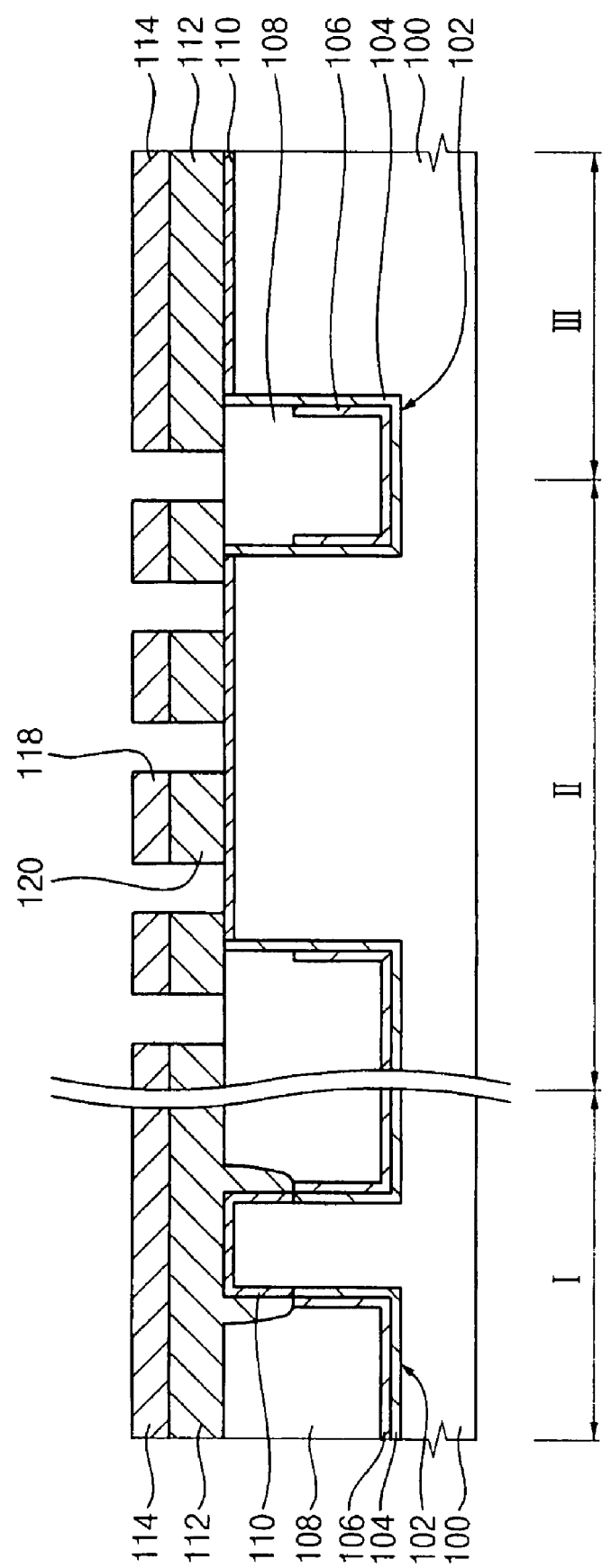

Referring to FIGS. 3 and 4, the photoresist material 116 is subsequently removed by an ashing process and/or a stripping process. Further referring to FIG. 4, the first conductive layer 112 is partially etched such that the portion of the first conductive layer 112 under the hard mask structures 118 remains to form mold structures 120 within second active region. The first conductive layer 112 is covered by the buffer layer 114 in the first and third active regions such that the first conductive layer 112 is not damaged during the formation of the mold structures 120.

Figure 5:
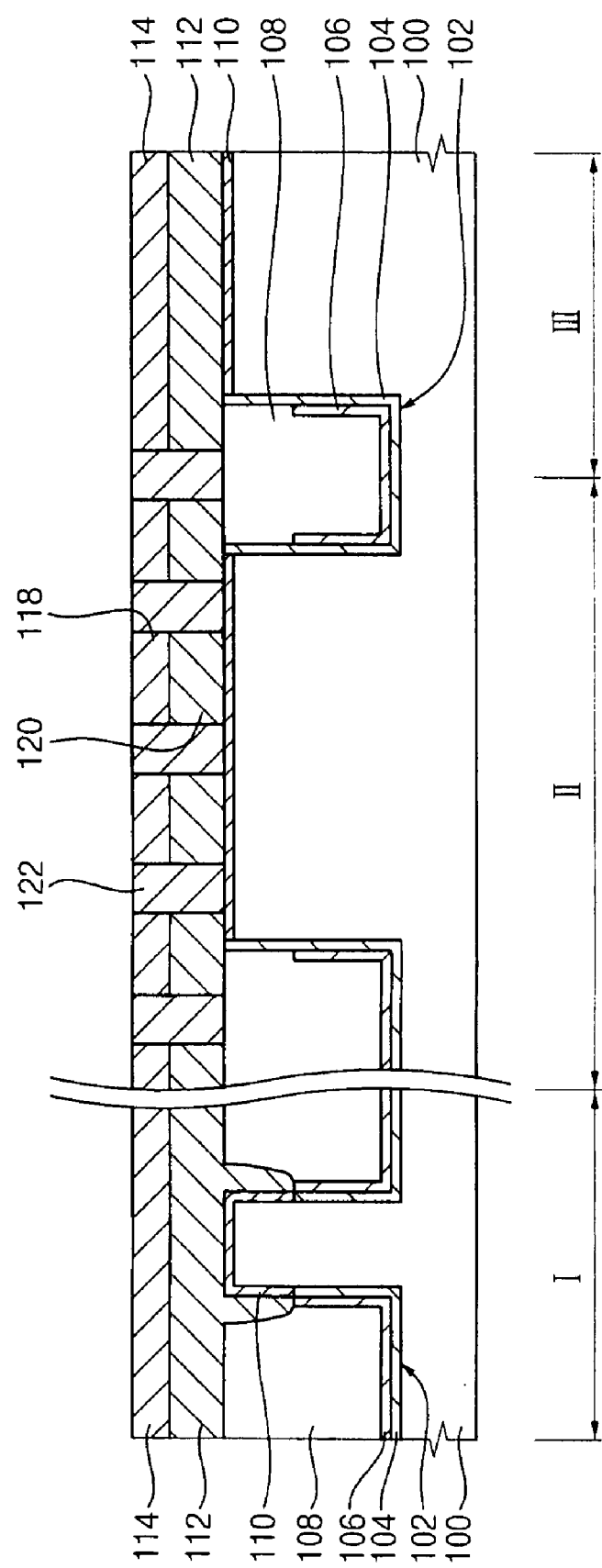

Referring to FIGS. 4 and 5, mask structures 122 are formed in spaces between the mold structures 120. For formation of such mask structures 122, a layer of an oxide material such as silicon oxide is deposited on the structures of FIG. 4 to fill the spaces between the mold structures 120. Subsequently, a CMP process is performed such that the silicon oxide is contained within the spaces between the mold structures 120 but with the mold structures 120 not being exposed. When the hard mask structures 118 and the buffer layer 114 are also comprised of silicon oxide, each of the mold structures 120 is buried by silicon oxide.

Figure 6:
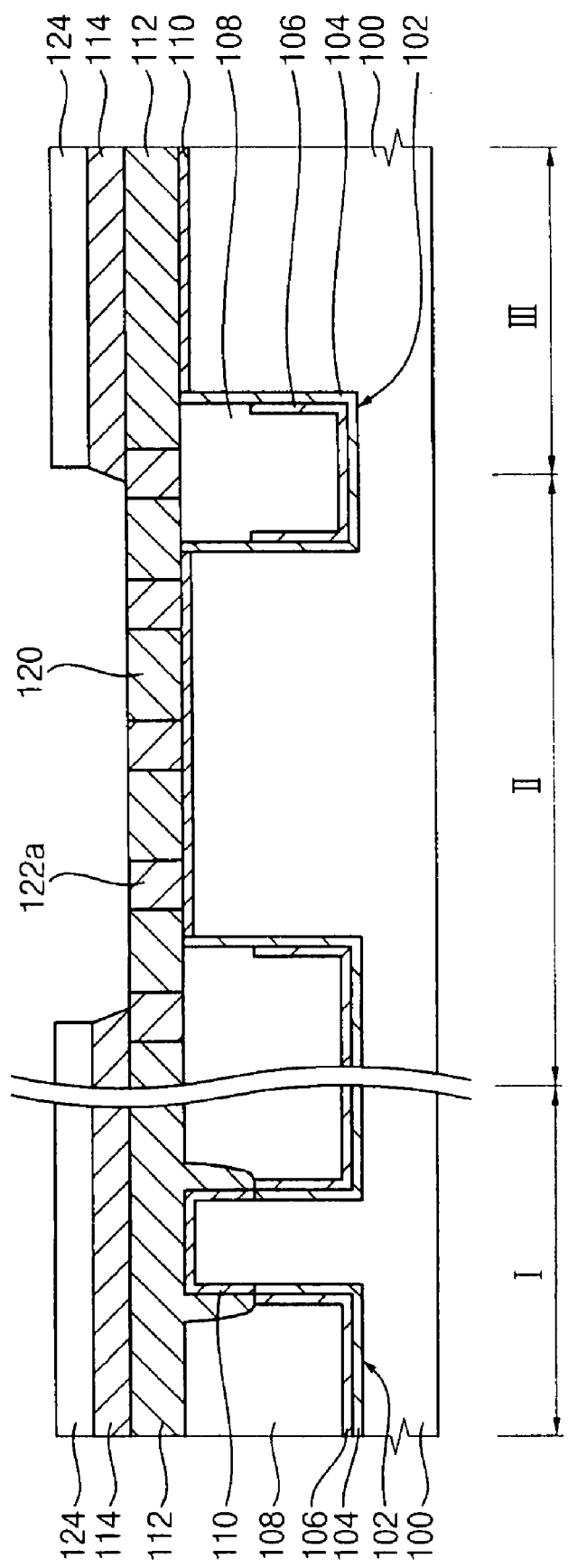

Referring to FIGS. 5 and 6, a subsequent photoresist material 124 is coated onto exposed surfaces of the structures of FIG. 5. The portion of the photoresist material 124 over the second active region is removed. Subsequently, the hard mask structures 118 and a top portion of the mask structures 122 as exposed in the second active region are etched away such as in a dry etch process until the mold structures 120 are exposed.

Such an etching process selectively etches oxide while preserving the mold structures 120 comprised of polysilicon. Because of the planarization of the mask structures 122, the remaining portions 122a of the mask structures 122 have a level upper surface after such an etch process. Since the photoresist pattern 124 covers the first and the third areas I and III, the buffer layer 114 over the first conductive layer 112 remains in the first and the third areas I and III after such an etch process.

Subsequently referring to FIGS. 6 and 7, the photoresist material is removed by an ashing process and/or a stripping process. In addition, the mold structures 120 comprised of polysilicon are selectively removed. Thus in FIG. 7, the mask structures 122a remain in the second active region.

Figure 7:
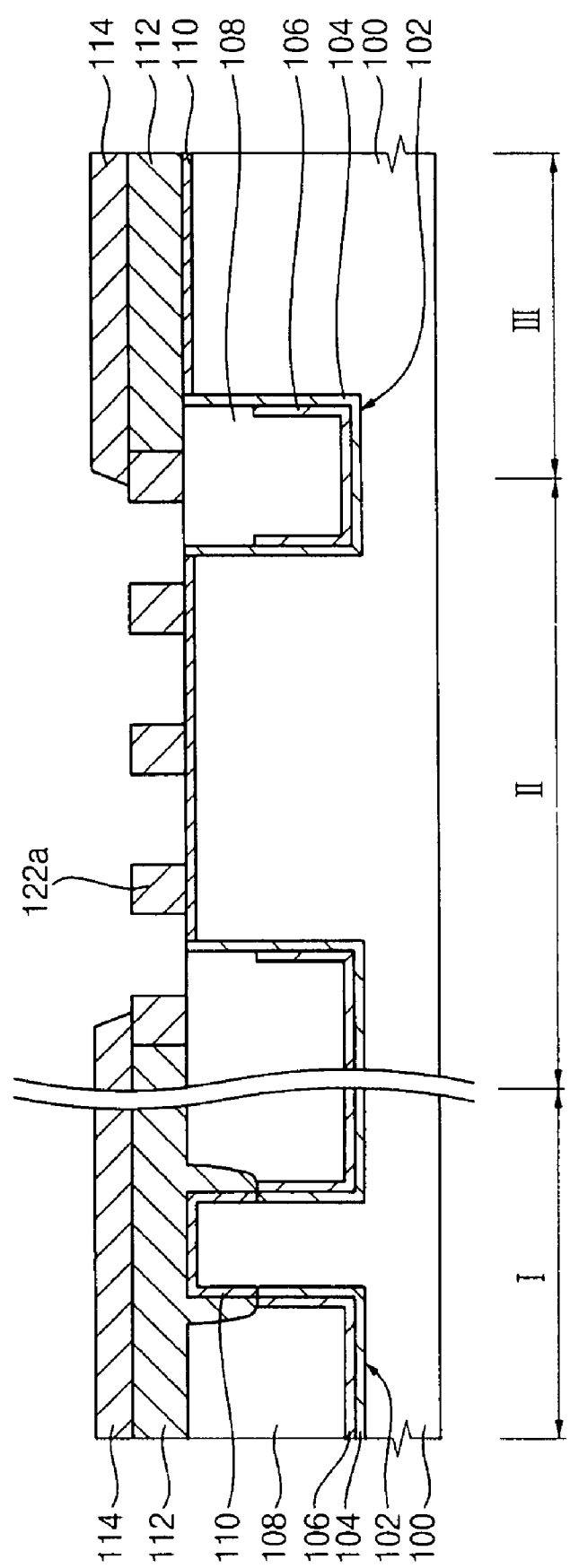
Figure 8:
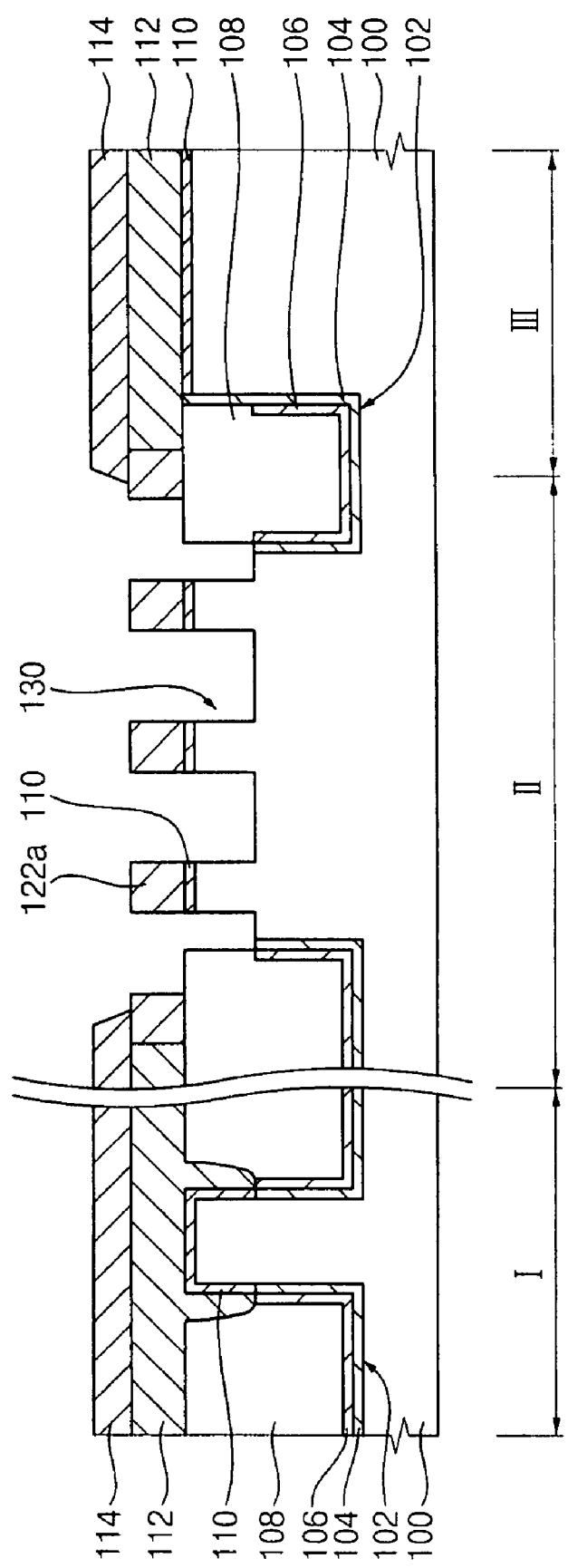

Referring to FIGS. 7 and 8, portions of the gate dielectric 110 and the semiconductor substrate 100 not under the mask structures 122a are partially etched using the mask structures 122a as an etching mask by an etching process such as a dry etch process. Such a partial etch results in forming a plurality of fins 130 which are protruding portions of the semiconductor substrate 100 in FIG. 8.

In this manner, the fins are formed in the second active region using mask structures 122a disposed between mold structures 120 that are formed from the first conductive layer 112 used for forming the gate electrodes in the first and third active regions. Thus, layouts for the first, second, and third active regions are integrated with respect to each-other.

In addition, the buffer layer 114 on the first conductive layer 112 is preserved in the first and the third active regions during formation of the fins 130 in the second active region. Thus, damage to the first conductive layer 112 and the gate dielectric 110 is prevented for preserving integrity of the MOSFETs to be formed in the first and the third active regions.

In an example embodiment of the present invention, an ion implantation process is performed into the second active region after formation of the fins 130. Such ion implantation is used for controlling a threshold voltage of the MOSFET to be formed in the second active region. Such an ion implantation process may be performed without forming an ion implantation mask in an example embodiment of the present invention.

Figure 9:
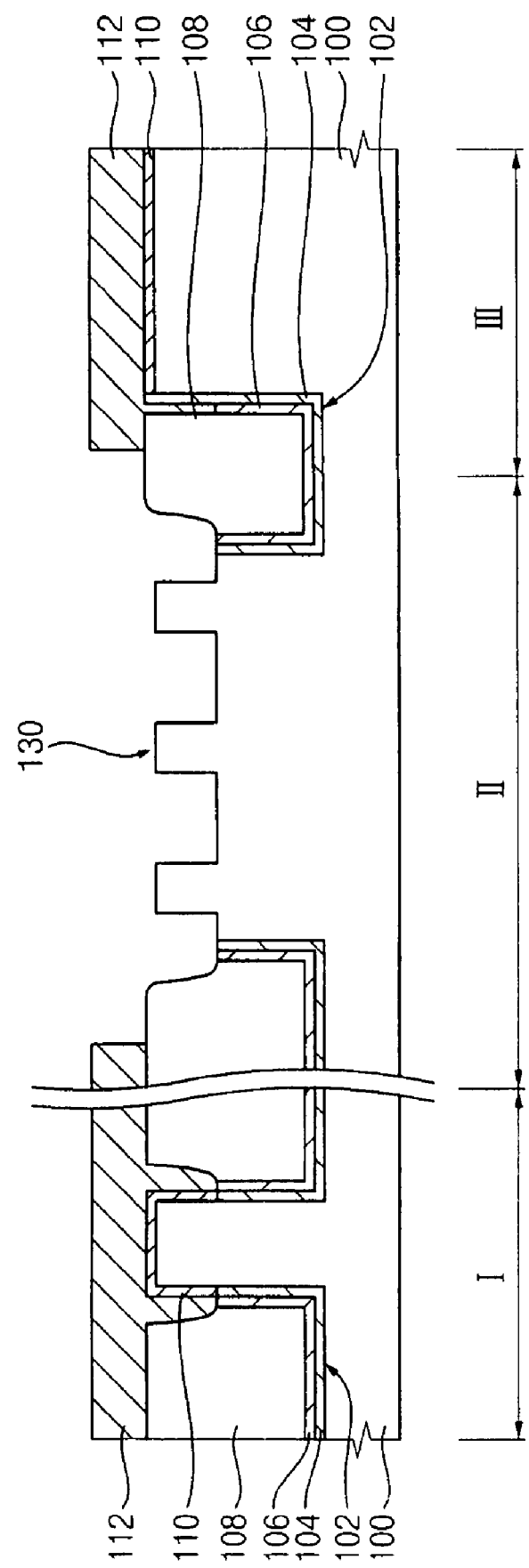

Referring to FIGS. 8 and 9, the mask structures 122a and the buffer layer 114 in the first, second, and third active regions are removed such as by a wet etch process or a dry etch process. To prevent damage to the second active region, the mask structures 122a and the buffer layer 114 may be advantageously removed by a wet etch process. In an example embodiment of the present invention, portions of the isolation structures 108 adjacent to the second active region may be etched together with the mask structures 122a and the buffer layer 114.

Figure 10:
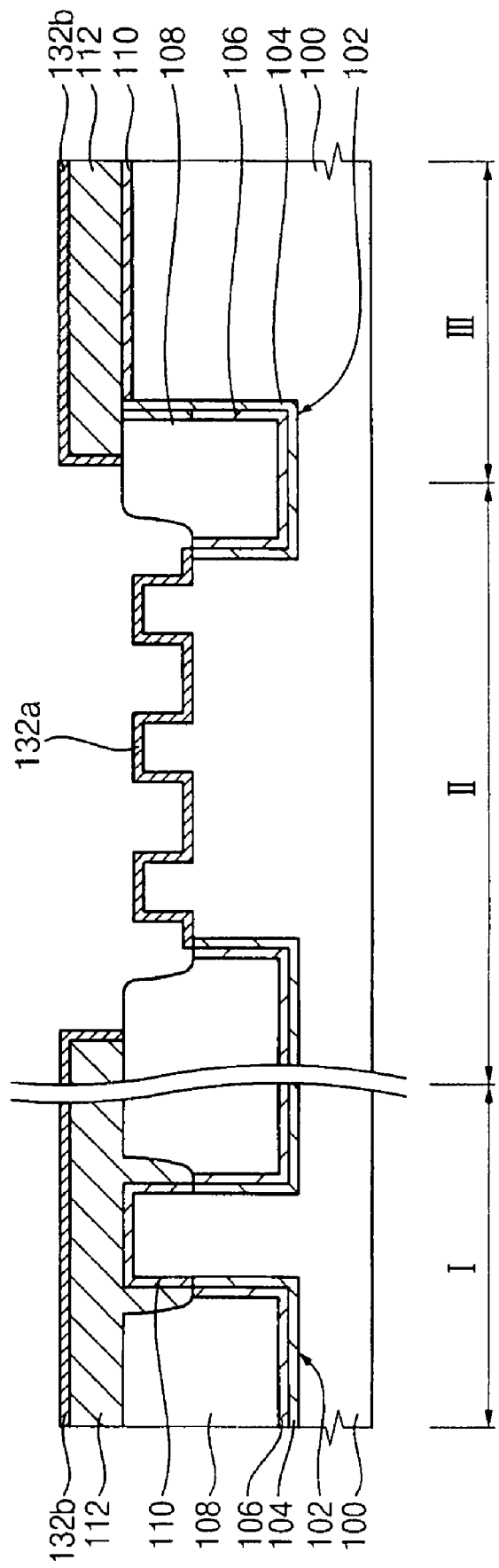

Subsequently referring to FIG. 10, exposed semiconductor surfaces of the second active region are oxidized to form a second gate dielectric material 132a in the second active region. The gate dielectric material 132a may include silicon oxide formed in a thermal oxidation process in an example embodiment of the present invention. During such a thermal oxidation process, silicon oxide 132b is also formed on the first conductive layer 112 in the first and third areas I and III.

The fins 130 in the second active region are formed using the mask structures 122a patterned from mold structures 120 that are formed from the first conductive layer 112. Accordingly, the gate dielectric 132a may be easily formed with a desired thickness by performing one thermal oxidation process. As a result, damage to the fins 130 may be effectively prevented to ensure desired width and height of the fins 130.

Figure 11:
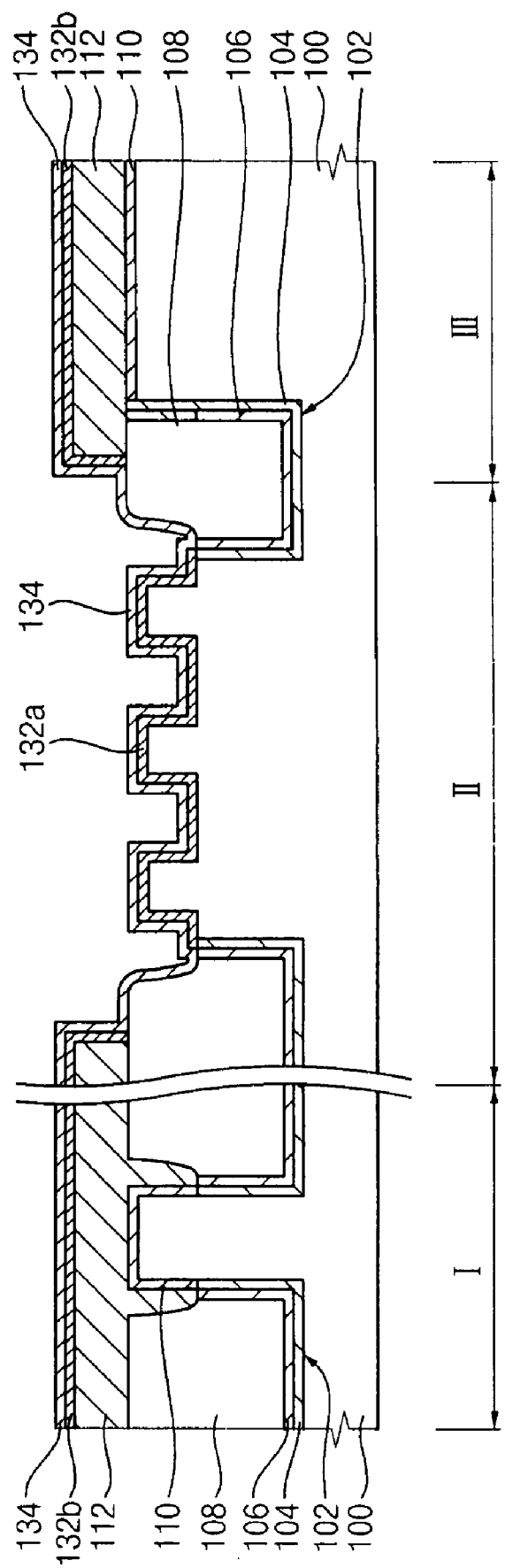

Subsequently referring to FIG. 11, a conductive film 134 is deposited on exposed surfaces including on the gate dielectric material 132a and 132b and the isolation structures 108. In one example embodiment of the present invention, the conductive film 134 may include a metallic material having a work function above about 4.5 eV. For example, the conductive film 134 may include titanium, tantalum, titanium nitride, or tantalum nitride.

The second MOSFET formed in the second active region with such a conductive film 134 has a raised threshold voltage. If the fins 130 have relatively small width, the channel region of the fin type transistor may be entirely depleted to result in low threshold voltage. In addition, the threshold voltage of such a fin type transistor may not be easily controlled using ion implantation alone. The conductive film 134 is used for more easily controlling the threshold voltage of the second MOSFET having the multiple fins 130 formed in the second active region.

The conductive film 134 including titanium nitride or tantalum nitride may not be easily etched by a general dry etch process. In that case, the conductive film 134 is formed to have a relatively thin thickness of about 50 Å to about 500 Å for easily patterning the conductive film 134. Since the conductive film 134 is formed on the silicon oxide 132b in the first and third areas I and III, contamination of the first conductive layer 112 and the gate dielectric 110 therein may be effectively prevented during formation of the conductive film 134.

Figure 12:
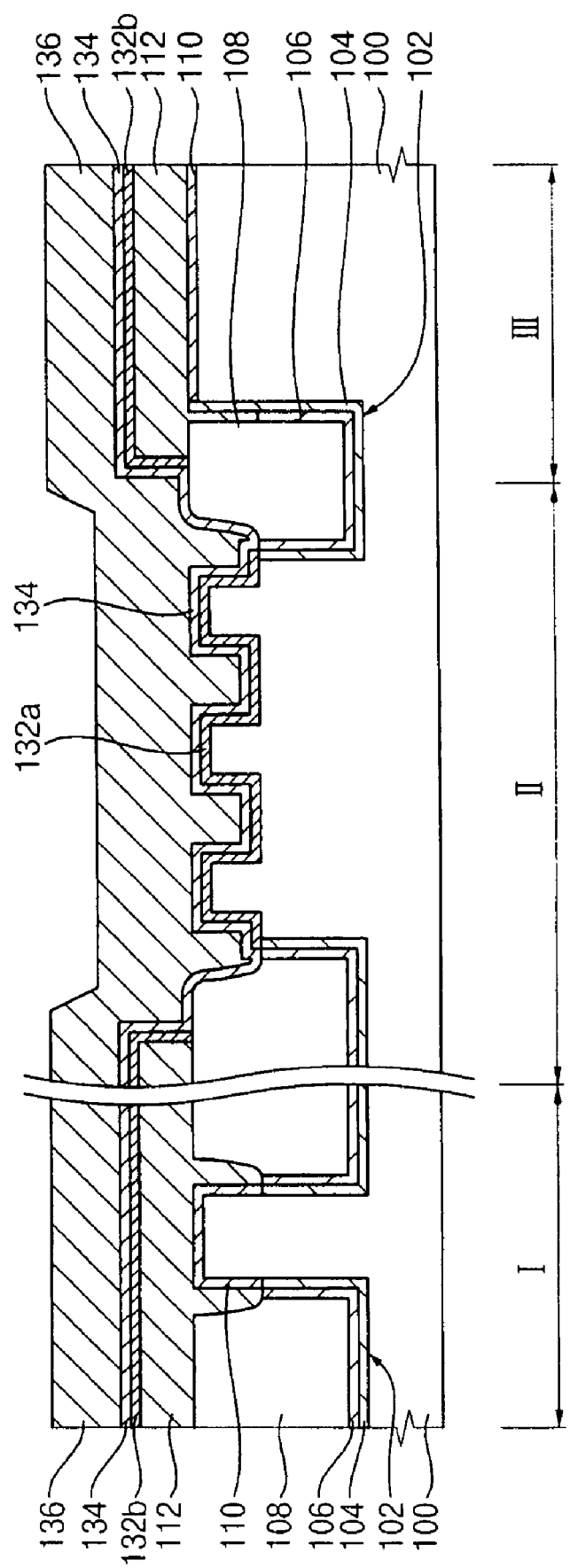

Since the first conductive layer 112 has been removed from the second area II while remaining in the first and third areas I and III, step differentials are present across the areas I, II, and III. To ameliorate such step differentials, a second conductive layer 136 is subsequently deposited as illustrated in FIG. 12. The second conductive layer 136 may include polysilicon having a thickness to sufficiently compensate the step of the second area II.

Figure 13:
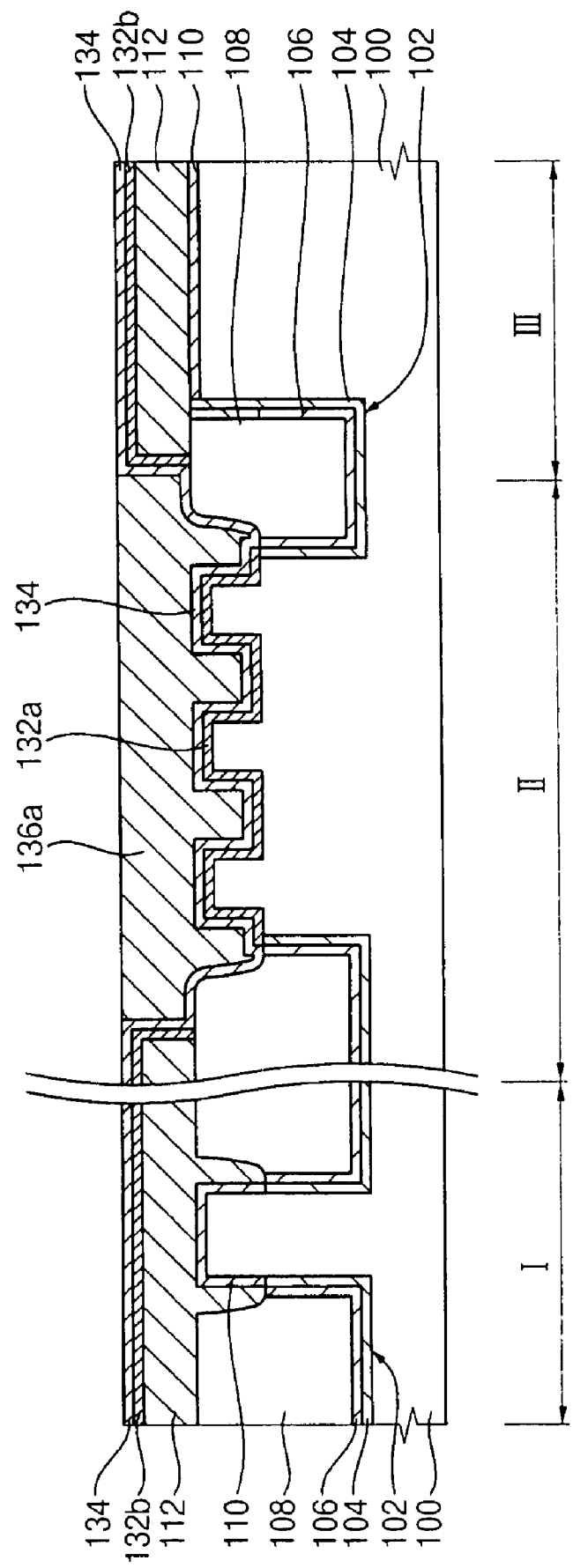
Figure 14:
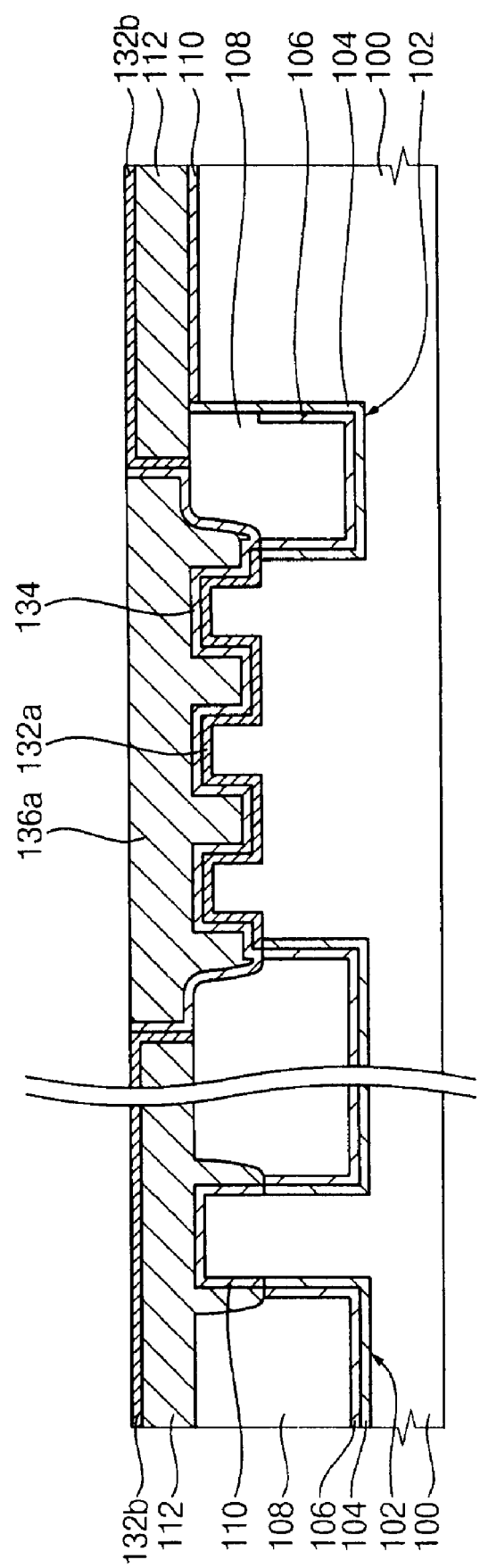

Subsequently referring to FIG. 13, a CMP process is performed such that the material 136a of the second conductive layer 136 is level with the conductive film 134 in the first and third areas I and III. Thereafter referring to FIG. 14, the exposed conductive film 134 is removed from the first and the third areas I and III such as by a wet etch process. Hence, the gate dielectric material 132b is exposed in the first and third areas I and III.

Figure 15:
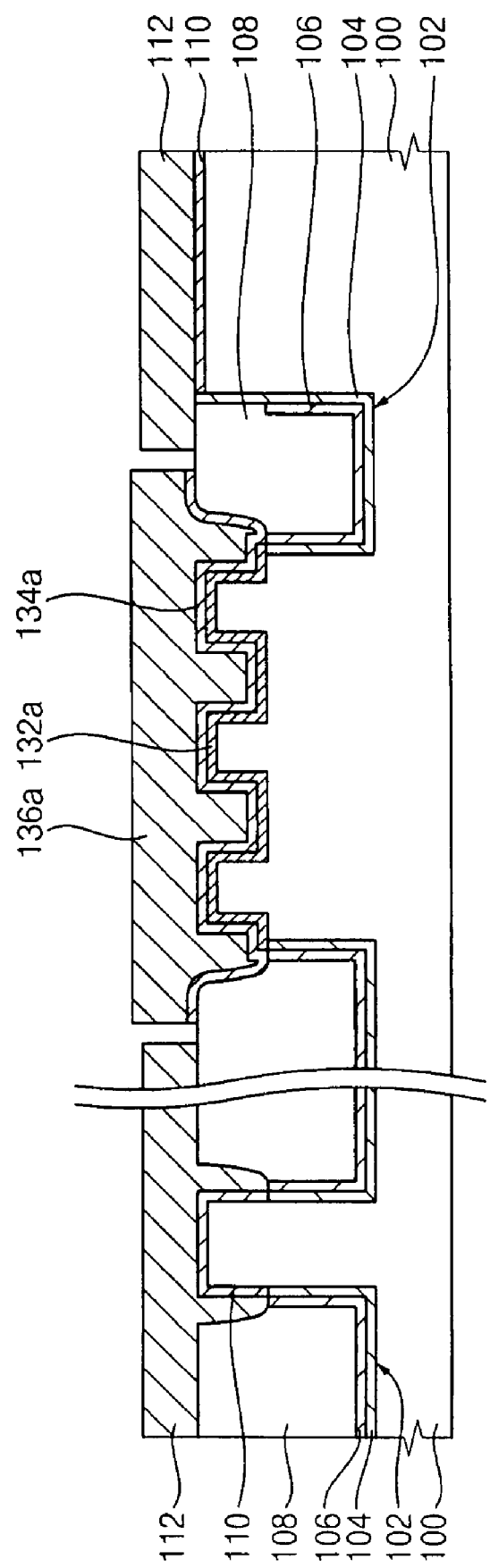

Referring to FIG. 15, the exposed gate dielectric material 132b in the first and third areas I and III is removed such as by a wet etch process until the first conductive layer 112 is exposed therein. In such an etch process, portions of the gate dielectric material 132b at boundaries between the first and second areas I and II and between the second and third areas II and III are also removed, thereby exposing portions of the isolation layers 108.

Further referring to FIG. 15, portions of the conductive film 134 positioned at the boundaries between the first and second areas I and II and between the second and third areas II and III are removed. During such removal of the gate dielectric material 132b and the first conductive film 134, the first gate dielectric material 110 in the first area I is not exposed to prevent contamination and damage to the first gate dielectric material 110.

Figure 16:
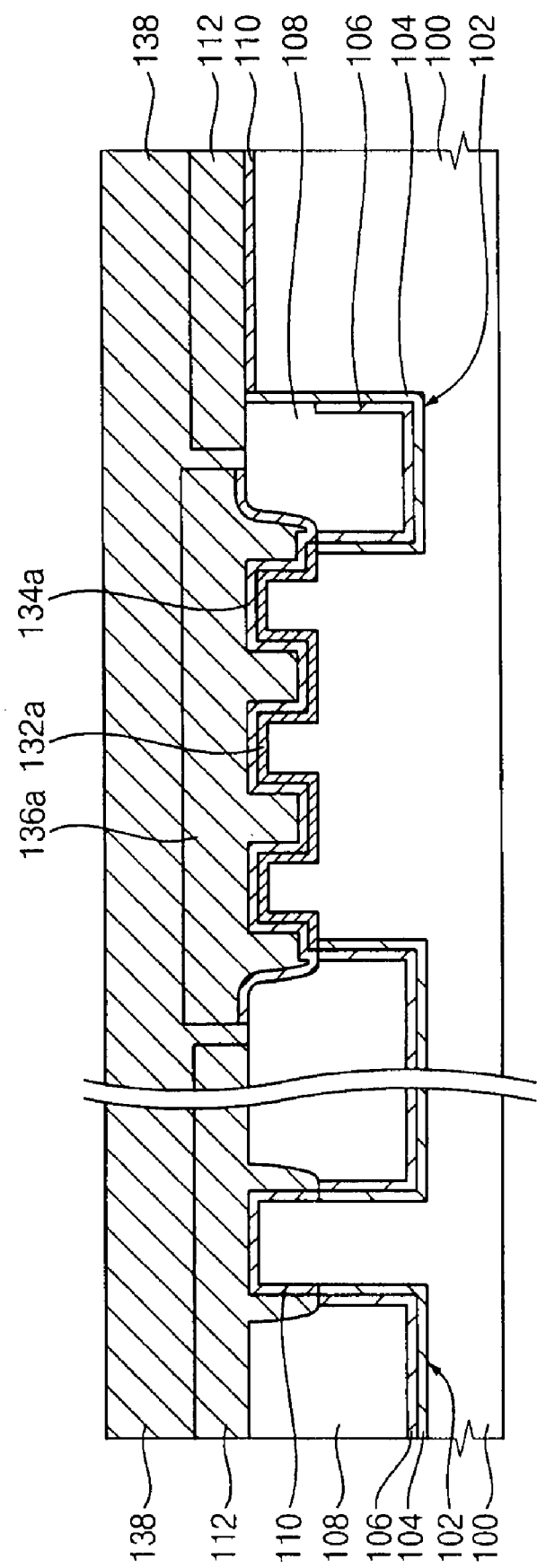

Subsequently referring to FIG. 16, a third conductive layer 138 is deposited on the first and second conductive layers 112 and 136a and for filling the gaps at the boundaries between the first and second areas I and II and between the second and third areas II and III. The third conductive layer 138 may include polysilicon according to an example embodiment of the present invention.

Thereafter, the first and third conductive layers 112 and 138 are patterned to form a first gate of the first MOSFET formed in the first active region. Such a first MOSFET is of a fin type with the single fin formed from the protruding semiconductor material of the first active region as the first conductive layer 112 remains to fill up the opening surrounding such a protruding portion.

Simultaneously, the second and third conductive layers 136a and 138 and the conductive film 134a are patterned to form a second gate of the second MOSFET formed in the second active region. Such a second MOSFET is of a fin type with the multiple fins 130 being covered by the second gate electrode.

Also simultaneously, the first and third conductive layers 112 and 138 are patterned to form a third gate of the third MOSFET formed in the third active region. Such a third MOSFET is of a planar type formed with the planer surface of the semiconductor substrate 100 in the third active region. Such first, second and third gate electrodes may be patterned by one photolithography process for simplicity of fabrication.

FIGS. 17, 18, 19, 20, 21, and 22 show cross-sectional views during fabrication of multiple MOSFETs according to another example embodiment of the present invention.

Figure 17:
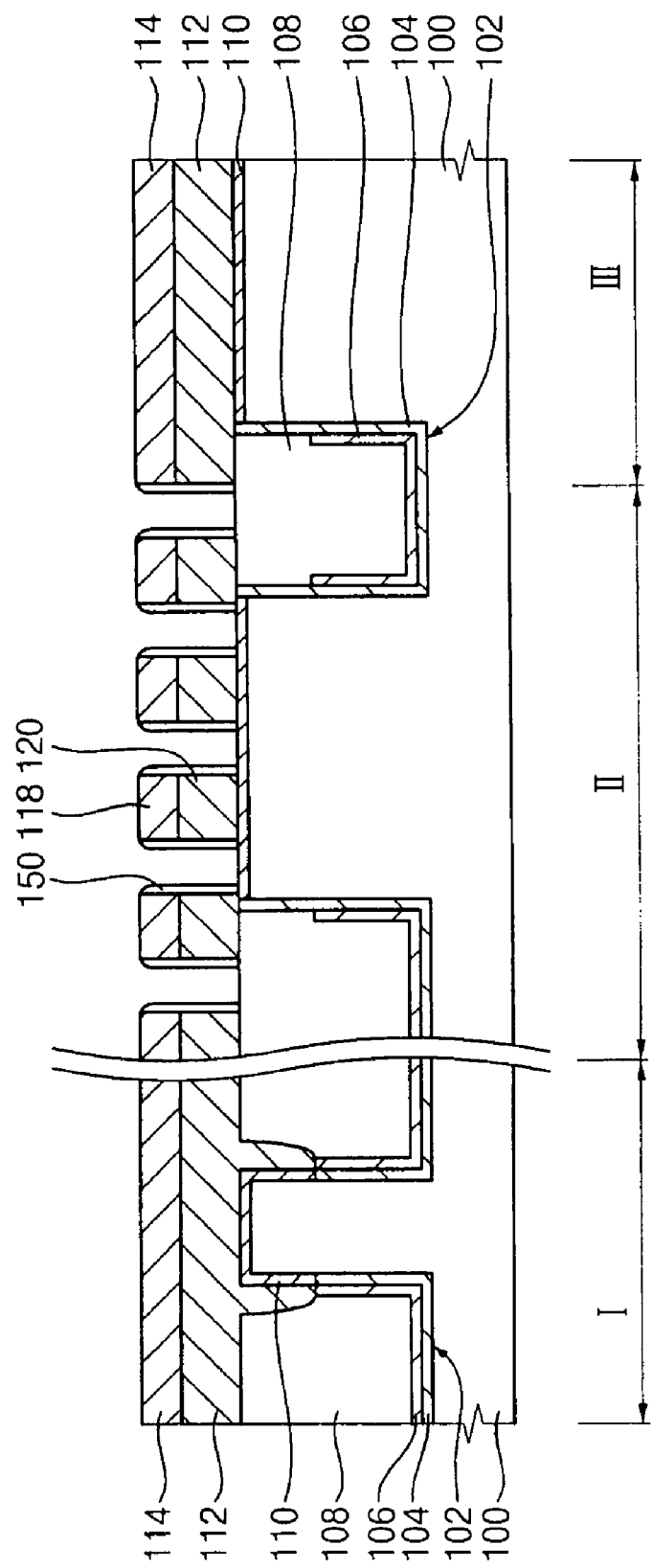
FIGS. 17, 18, 19, 20, 21, and 22 show cross-sectional views during fabrication of multiple field effect transistors according to a second example embodiment of the present invention.

FIG. 17 continues after the resultant structures of FIG. 5 with spacers 150 being formed on sidewalls of the mold structures 120 and the hard mask structures 118. For forming the spacers 150, an oxide layer (not illustrated) including silicon oxide, for example, is initially deposited after FIG. 5. Such an oxide layer may not fully fill up the gaps between the mold structures 120. Subsequently, the oxide layer is anisotropically etched to form the spacers 150 at the sidewalls of the mold structures 120 and the hard mask structures 118. The spacers 150 are also formed on the sidewalls of the first conductive layer 112 and the buffer layer 114 in the first and third areas I and III.

Figure 18:
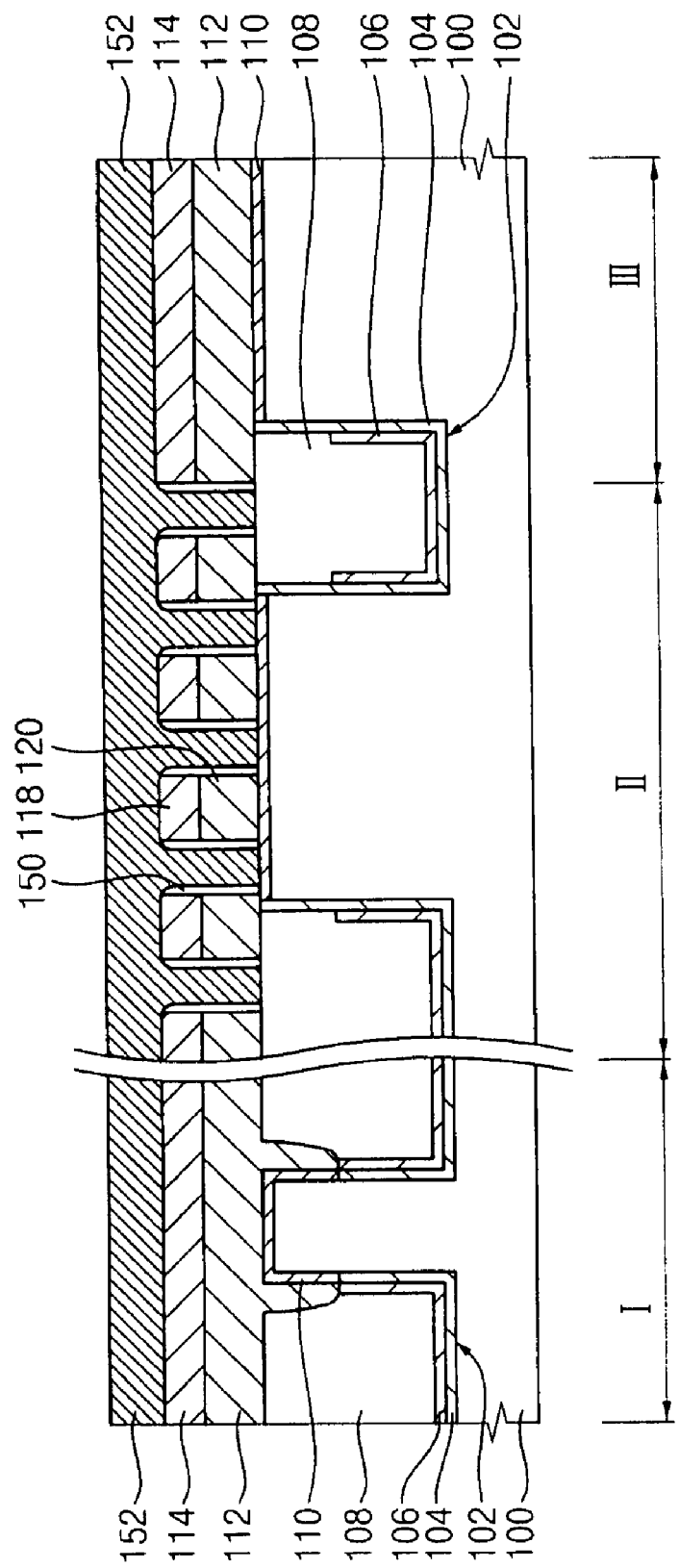

Referring to FIG. 18, a second conductive layer 152 is subsequently deposited on the buffer layer 114 and the hard mask structures 118 to completely fill up the gaps between the spacers 150. The second conductive layer 152 may include polysilicon as an example filling material in an embodiment of the present invention.

Figure 19:
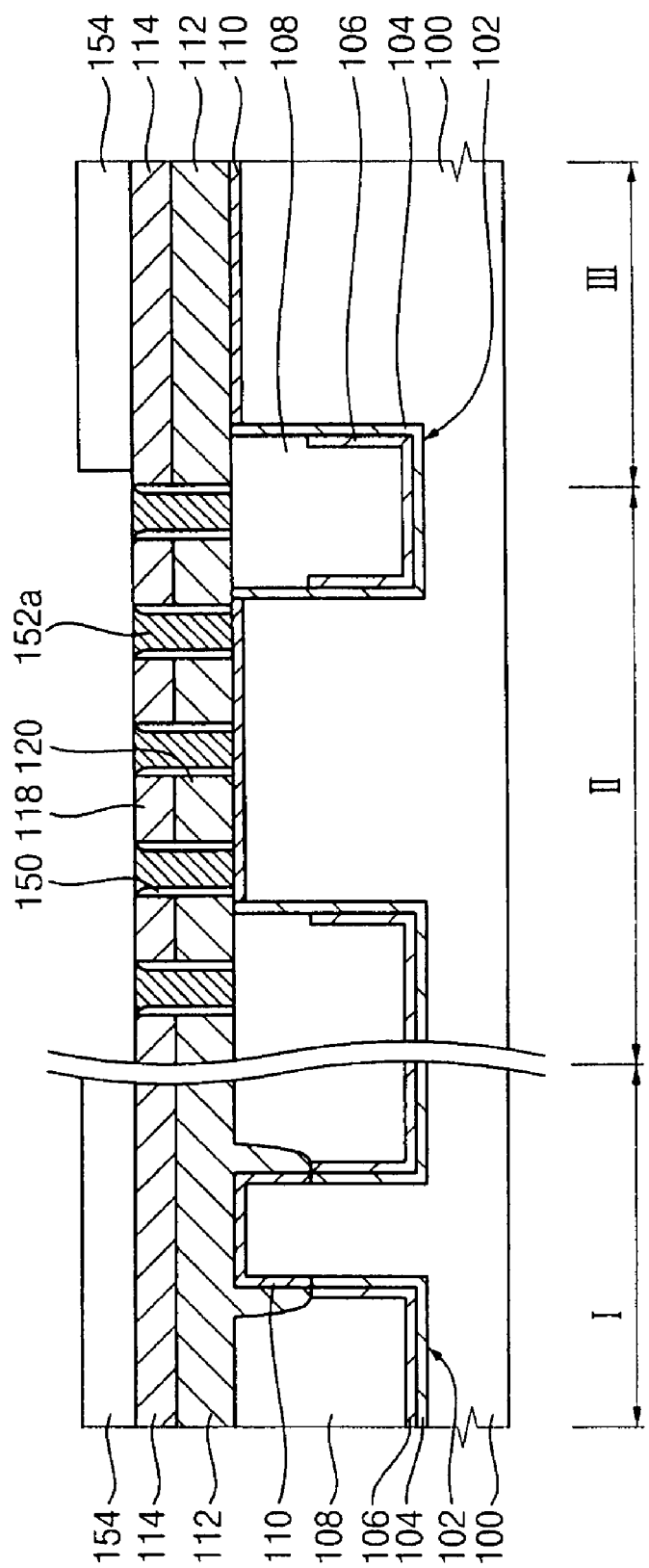

Referring to FIG. 19, the second conductive layer 152 is planarized such as in a CMP process for example until the buffer layer 114 and the hard mask structures 118 are exposed. In that case, conductive structures 152a which are remaining portions of the second conductive layer 152 are formed at the gaps between the spacers 150. In an example embodiment of the present invention, portions of the second conductive layer 152 on the first and third areas I and III are completely removed such that the buffer layer 114 is exposed.

Thereafter referring to FIG. 19, a photoresist material 154 is deposited and patterned to remain on the buffer layer 114 in the first and third areas I and III. Thus, the photoresist material 154 selectively exposes the second area II.

Figure 20:
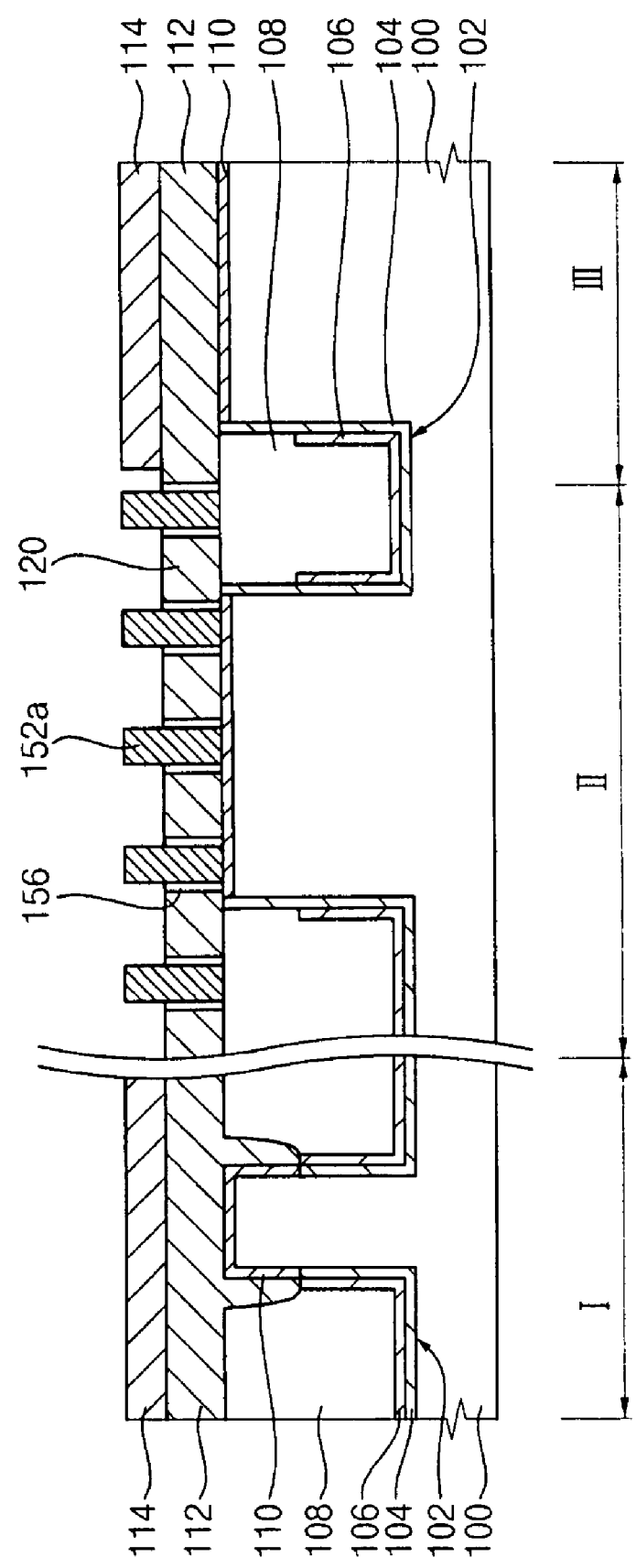

Subsequently referring to FIG. 20, the exposed hard mask structures 118 are removed such as by a dry etch process for example such that the mold structures 120 are exposed. Using selective etching, the mold structures 120 including polysilicon are not etched whereas the hard mask structures 118 including silicon oxide are selectively etched.

In an example embodiment of the present invention, upper portions of the spacers 150 contacting the hard mask structures 118 are also slightly etched during such selective etching. Thereafter, the photoresist material 154 is removed from the buffer layer 114 by an ashing process and/or a stripping process.

Figure 21:
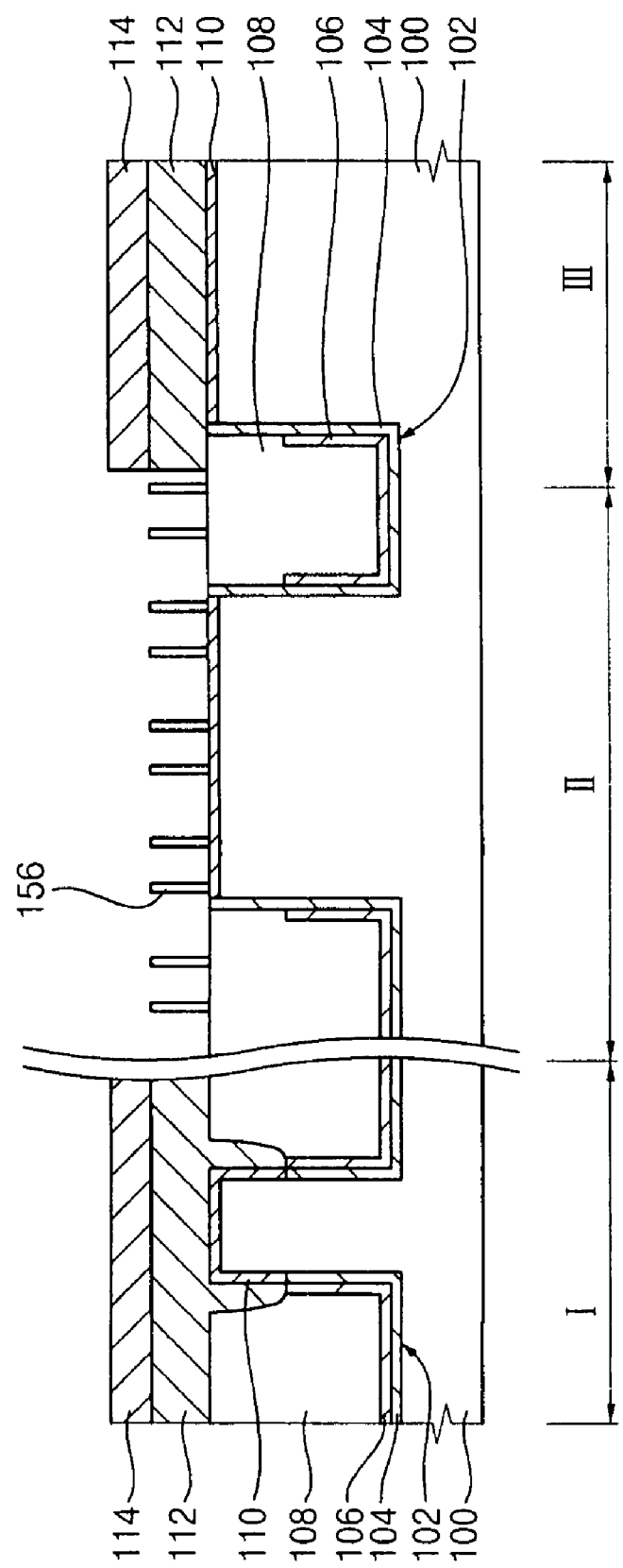
Figure 22:
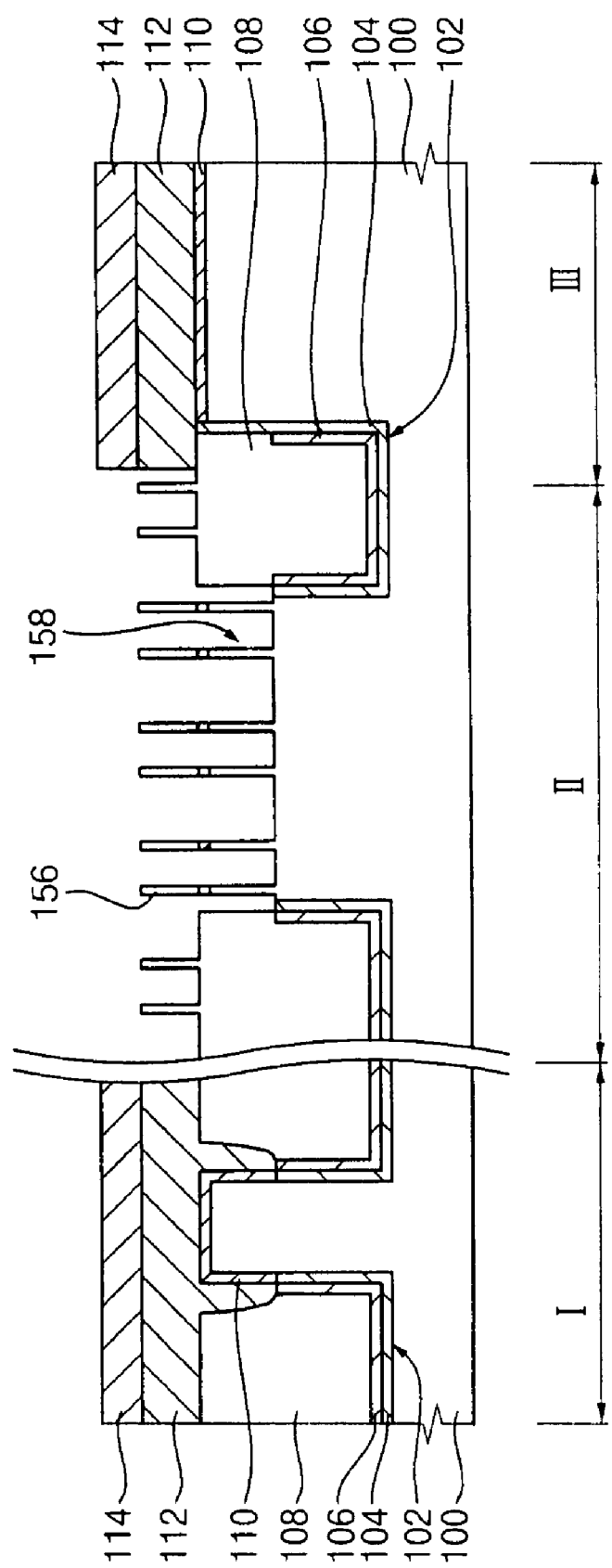

Referring to FIG. 21, the exposed mold structures 120 and the conductive structures 152a are selectively removed from the second active region such that the spacers 156 remain in the second active region. Referring to FIG. 22, portions of the first gate dielectric material 110 and the semiconductor substrate 100 not disposed under the spacers 156 are etched such as in a dry etch process for example to form multiple fins 158.

The spacers 156 having relatively thin width are used for forming the fins 158 also having thin width. Thus, the number of the fins 158 may be increased significantly in FIG. 22 from other processes for forming multiple fins of a fin type MOSFET.

As described above, the buffer layer 114 formed on the first conductive layer 112 in the first area I remains during the above processes for forming the fins 158. Thus, damage to the first conductive layer 112 and in turn failure of the MOSFET formed in the first area I may be effectively prevented.

The second MOSFET formed with the fins 158 of FIG. 22 in the second active region may be fabricated with subsequent similar steps as described in reference to FIGS. 9, 10, 11, 12, 13, 14, 15, and 16. In addition, the first and third MOSFETs in the first and third active regions may be similarly fabricated during such subsequent steps as described in reference to FIGS. 9, 10, 11, 12, 13, 14, 15, and 16.

In this manner, MOSFETs of different types and structures may be simultaneously formed on a substrate by simplified processes and with preserved integrity of the MOSFETs for improved reliability. The foregoing is illustrative of the present invention and is not to be construed as limiting thereof.

Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims.

In the claims, any means-plus-function clause is intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of fabricating multiple field effect transistors (FETs), comprising:
    depositing a first conductive layer over first and second active regions of a semiconductor substrate;
    patterning the first conductive layer over the second active region to form mold structures;
    forming at least one mask structure between the mold structures;
    patterning the second active region such that a remaining portion of the semiconductor substrate under each of the at least one mask structure forms a respective fin of a second field effect transistor (FET); and
    patterning the first conductive layer over the first active region to form a first gate of a first field effect transistor (FET).

2. The method of claim 1, further comprising:
    forming a plurality of mask structures between the mold structures; and
    patterning the second active region such that remaining portions of the semiconductor substrate under the mask structures forms multiple fins of the second FET.

3. The method of claim 2, further comprising:
    forming a gate dielectric material on the fins; and
    patterning a second conductive layer formed over the gate dielectric material to form a second gate of the second FET.

4. The method of claim 3, further comprising:
    forming a conductive film between the gate dielectric material and the second conductive layer to adjust a threshold voltage of the second FET.

5. The method of claim 4, wherein the conductive film comprises titanium, tantalum, titanium nitride, or tantalum nitride.

6. The method of claim 3, further comprising:
    implanting a dopant into the fins before forming the gate dielectric material.

7. The method of claim 3, further comprising:
    depositing a third conductive layer on the first and second conductive layers;
    patterning the first and third conductive layers to form the first gate of the first FET; and
    patterning the second and third conductive layers to form the second gate of the second FET.

8. The method of claim 1, further comprising:
    forming a buffer layer that remains over the first conductive layer in the first active region while the mold structures are being formed over the second active region.

9. The method of claim 1, further comprising:

forming a first gate dielectric material of the first FET between the first conductive layer and the substrate, wherein the first gate dielectric material and the first conductive layer are patterned over the substrate to form the first FET of a planar type.

10. The method of claim 1, further comprising:

forming a trench isolation structure that surrounds the first active region;

etching away portions of the trench isolation structure to expose side walls of the first active region to form a single fin of the first FET; and forming a gate dielectric material at exposed surfaces of the semiconductor substrate in the first active region;

wherein the first conductive layer is formed on the gate dielectric material in the first active region.

11. The method of claim 10, further comprising:

forming the gate dielectric material also on an exposed surface of a third active region of the semiconductor substrate;

forming the first conductive layer also on the gate dielectric material in the third active region; and patterning the gate dielectric material and the first conductive layer in the third active region to form another field effect transistor (FET) of a planar type.

12. A method of fabricating multiple field effect transistors (FETs), comprising:

depositing a first conductive layer over first and second active regions of a semiconductor substrate;

patterning the first conductive layer over the second active region to form mold structures;

forming spacers at sidewalls of the mold structures;

patterning the second active region such that remaining portions of the semiconductor substrate under the spacers form fins of a second field effect transistor (FET); and patterning the first conductive layer over the first active region to form a first gate of a first field effect transistor (FET).

13. The method of claim 12, further comprising:

forming filling material between the spacers; and etching away material surrounding the spacers over the second active region before the step of patterning the second active region.

14. The method of claim 12, further comprising:

forming a gate dielectric material on the fins; and patterning a second conductive layer formed over the gate dielectric material to form a second gate of the second FET.

15. The method of claim 14, further comprising:

forming a conductive film between the gate dielectric material and the second conductive layer to adjust a threshold voltage of the second FET.

16. The method of claim 14, further comprising:

depositing a third conductive layer on the first and second conductive layers;

patterning the first and third conductive layers to form the first gate of the first FET; and patterning the second and third conductive layers to form the second gate of the second FET.

17. The method of claim 12, further comprising:

forming a buffer layer that remains over the first conductive layer in the first active region while the spacers are being formed over the second active region.

18. The method of claim 12, further comprising:

forming a first gate dielectric material of the first FET between the first conductive layer and the substrate, wherein the first gate dielectric material and the first conductive layer are patterned over the substrate to form the first FET of a planar type.

19. The method of claim 12, further comprising:

forming a trench isolation structure that surrounds the first active region;

etching away portions of the trench isolation structure to expose side walls of the first active region to form a single fin of the first FET; and forming a gate dielectric material at exposed surfaces of the semiconductor substrate in the first active region;

wherein the first conductive layer is formed on the gate dielectric material in the first active region.

20. The method of claim 19, further comprising:

forming the gate dielectric material also on an exposed surface of a third active region of the semiconductor substrate;

forming the first conductive layer also on the gate dielectric material in the third active region; and patterning the gate dielectric material and the first conductive layer in the third active region to form another field effect transistor (FET) of a planar type.

* * * * *